United States Patent
Chen

(10) Patent No.: US 6,751,102 B1
(45) Date of Patent: Jun. 15, 2004

(54) CIRCUIT BOARD MOUNTING APPARATUS

(75) Inventor: Yun-Lung Chen, Tu-Chen (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 10/388,986

(22) Filed: Mar. 13, 2003

(30) Foreign Application Priority Data

Dec. 20, 2002 (TW) .................... 91220823 U

(51) Int. Cl.[7] .............. H05K 5/00; H05K 5/04; H05K 5/06
(52) U.S. Cl. ............ 361/758; 361/759; 361/742; 361/804; 361/683; 174/138 D; 174/138 G
(58) Field of Search .............. 361/758, 759, 361/742, 804, 683, 752, 753, 740, 741, 747, 756; 174/138 D, 138 G

(56) References Cited

U.S. PATENT DOCUMENTS

| | | | | |
|---|---|---|---|---|
| 4,938,703 A | * | 7/1990 | Nakano | ............ 439/74 |
| 5,833,480 A | * | 11/1998 | Austin | ............ 439/95 |
| 5,978,232 A | * | 11/1999 | Jo | ............ 361/796 |
| 6,017,226 A | * | 1/2000 | Jeffries et al. | ............ 439/92 |
| 6,186,800 B1 | * | 2/2001 | Klein et al. | ............ 439/95 |
| 6,347,042 B1 | * | 2/2002 | White | ............ 361/784 |
| 6,424,537 B1 | * | 7/2002 | Paquin et al. | ............ 361/752 |
| 2002/0181191 A1 | * | 12/2002 | Huang | ............ 361/683 |

\* cited by examiner

*Primary Examiner*—Kamand Cuneo
*Assistant Examiner*—Thanh Y. Tran
(74) *Attorney, Agent, or Firm*—Wei Te Chung

(57) ABSTRACT

A mounting apparatus includes a plurality of standoffs (1) bent from a bottom plate (10) a computer enclosure (5). Each standoff includes a support body (12) bent perpendicularly from the bottom plate, and a mounting body (14) bent perpendicularly from a distal end of the support body. A rib (122) is formed by stamping the support body at a bottom portion thereof adjacent the bottom plate. The rib has a generally triangular pyramidal configuration. The mounting body includes a connection (16) bent perpendicularly from a distal end of the support body, a bent position (18) bent upwardly from a distal end of the connection portion, and fixing portion (20) bent horizontally from a distal end of the bent portion away from the connection portion. A mounting hole (22) is defined in the fixing portion. A circuit board (2) is fixed to the standoffs with screws.

13 Claims, 4 Drawing Sheets

CIRCUIT BOARD MOUNTING APPARATUS

BACKGROUND OF THE INVENTION

1. Field of the Invention

The present invention relates to securing of components inside electronic apparatuses, and particularly to a mounting apparatus for mounting circuit boards on support structures of an electronic apparatus such as a bottom plate of a computer.

2. Related Art

A main circuit board such as a motherboard is the mainstay of electronic components used in a typical personal computer system. Firm and accurate mounting of the motherboard in the computer system is important for the computer system to operate properly and reliably. Mounting apparatuses are often required for mounting a motherboard in a carrier of the computer system.

A conventional mounting apparatus comprises a hollow sleeve, a screw and a nut. The hollow sleeve is extended through corresponding mounting holes of the motherboard and the carrier. The screw is extended through the hollow sleeve and engages with the nut. Another conventional mounting apparatus is a plastic, dowel-like piece having elastic mounting wings inserted into corresponding recesses of the carrier, thereby fixing a motherboard on the carrier. Examples of both of these conventional mounting apparatuses can be found in U.S. Pats. Nos. 4,523,883, 4,622,725, and 4,970,761, and in Taiwan Patent Applications Nos. 87212258, 88209977, and 89207516. However, both said mounting apparatuses are separate from the carrier, which makes assembly of the separate parts unduly difficult.

A relatively recent improvement in the field of mounting of a motherboard in a computer is illustrated and described in Taiwan Patent Application No. 89212152 and China Patent Application No. 00201452.1. The motherboard is mounted on supporting devices that are integral with a carrier plate of a computer enclosure. Each supporting device is a cone-shaped projection formed on the carrier plate. An upper end of the supporting device is flat, and defines a central screw hole therein. Screws are extended through mounting holes of the motherboard and the screw holes of the supporting devices. Thus the motherboard is mounted on the computer enclosure. However, the structure of the supporting device is difficult to manufacture.

Thus an improved circuit board mounting apparatus which overcomes the above-mentioned problems is desired.

SUMMARY OF THE INVENTION

Accordingly, an object of the present invention is to provide a simple and low-cost mounting apparatus which allows easy and convenient installation of a circuit board into a computer enclosure.

Another object of the present invention is to provide a mounting apparatus for installation of a circuit board into a computer enclosure, the mounting apparatus having high mechanical strength.

To achieve the above objects, a circuit board mounting apparatus in accordance with a preferred embodiment of the present invention comprises a plurality of standoffs bent from a bottom plate of a computer enclosure. Each standoff includes a support body bent perpendicularly from the bottom plate, and a mounting body bent perpendicularly from a distal end of the support body. A rib is formed by stamping the support body at a bottom portion thereof adjacent the bottom plate. The rib enhances a mechanical strength of the mounting body. The rib has a generally triangular pyramidal configuration, with a correspondingly shaped cavity defined at an inside of the support body. The mounting body includes a connection portion bent perpendicularly from a distal end of the support body, a bent portion bent upwardly from a distal end of the connection portion, and a fixing portion bent horizontally from a distal end of the bent portion away from the connection portion. A mounting hole is defined in the fixing portion. When a motherboard is placed on the standoffs, locking members such as screws are extended through the mounting holes to fix the motherboard to the standoffs.

In an alternative embodiment, the bent portion is bent downwardly from the distal end of the connection portion. In a further alternative embodiment, the rib has a generally parallelepiped configuration.

Other objects, advantages and novel features of the present invention will be drawn from the following detailed description of preferred embodiments of the present invention with the attached drawings, in which:

DESCRIPTION OF THE PREFERRED EMBODIMENTS

The present invention will be described in its preferred embodiments, and in conjunction with equipment such as a computer enclosure and a circuit board such as a motherboard.

Figure 1:
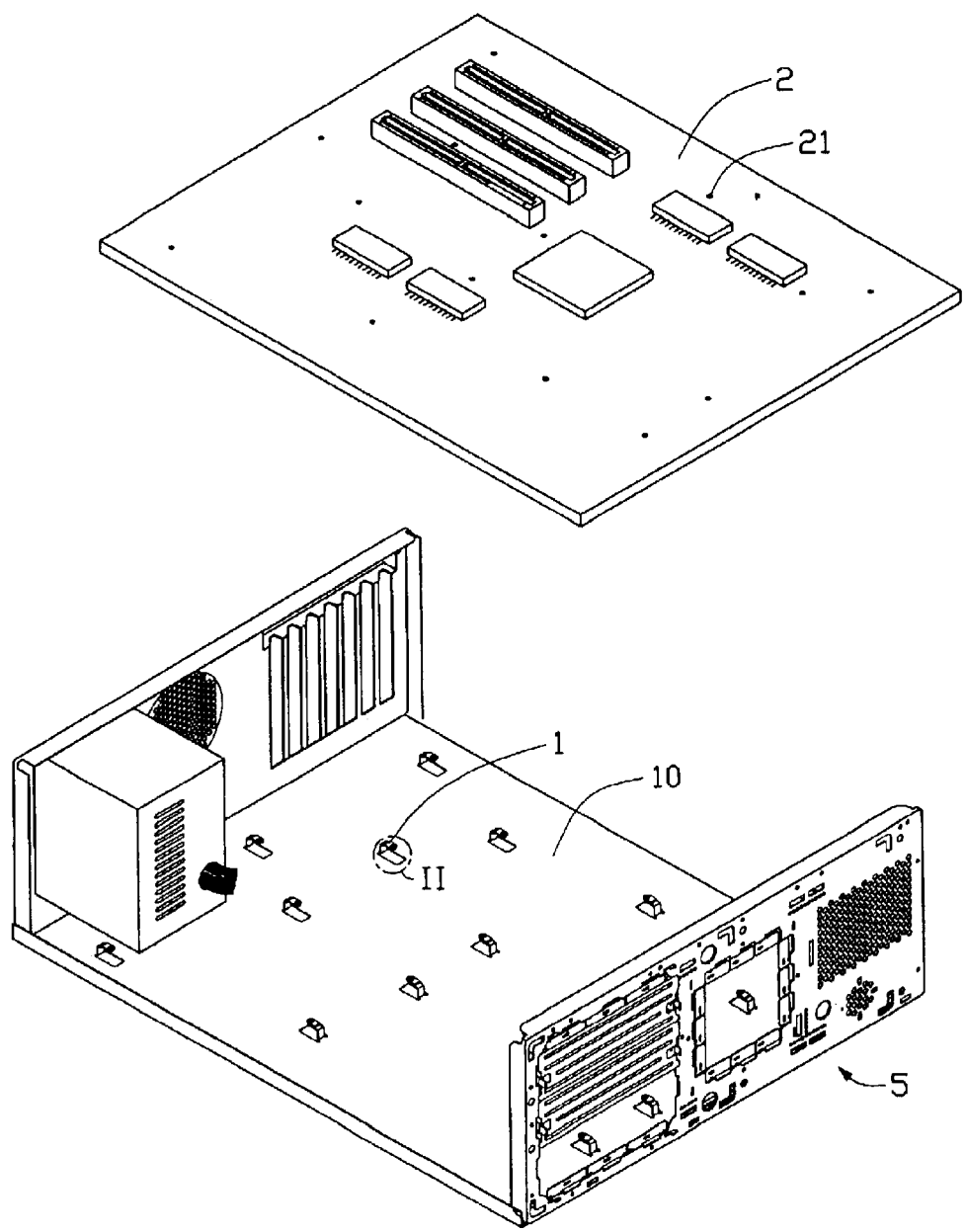
FIG. 1 is an isometric view of a circuit board mounting apparatus in accordance with a preferred embodiment of the present invention, the mounting apparatus being part of a computer enclosure, and showing a motherboard ready to be fixed to the mounting apparatus.

FIG. 1 shows a circuit board mounting apparatus in accordance with a preferred embodiment of the present invention, together with a motherboard 2. The mounting apparatus includes a plurality of standoffs 1 bent upwardly from a bottom plate 10 of a computer enclosure 5. The motherboard 2 is attached to the standoffs 1.

The motherboard 2 defines a plurality of mounting holes 21 corresponding to the standoffs 1. Locking members such as screws (not shown) are extended through the mounting holes 21 to fix the motherboard 2 to the standoffs 1.

Figure 2:
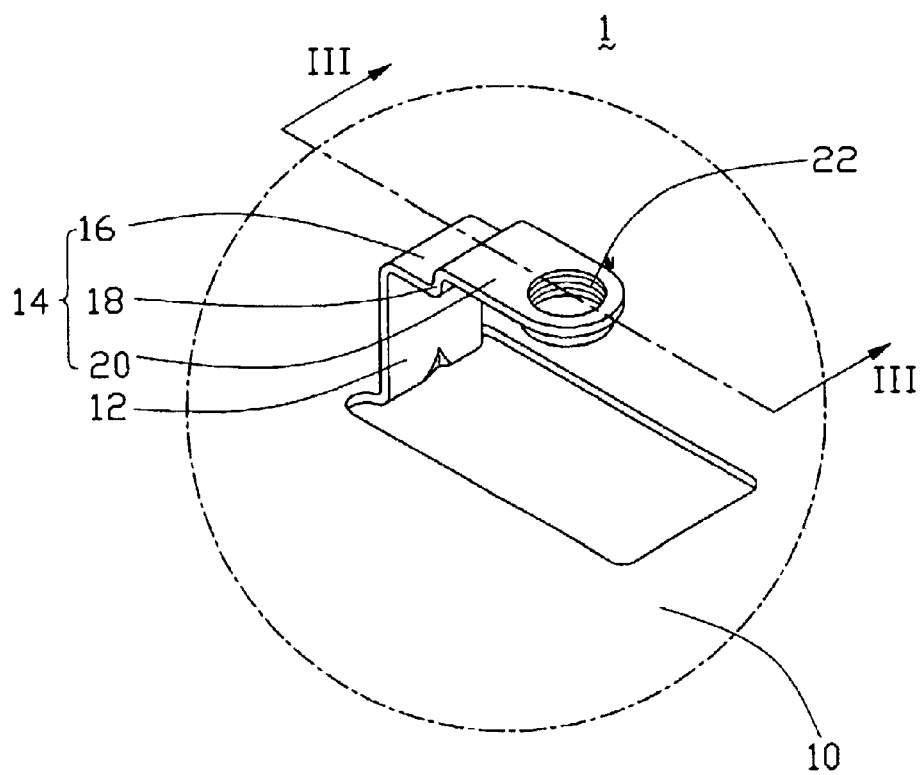
FIG. 2 is an enlarged view of an encircled portion II of FIG. 1, showing a standoff of said mounting apparatus.
Figure 3:
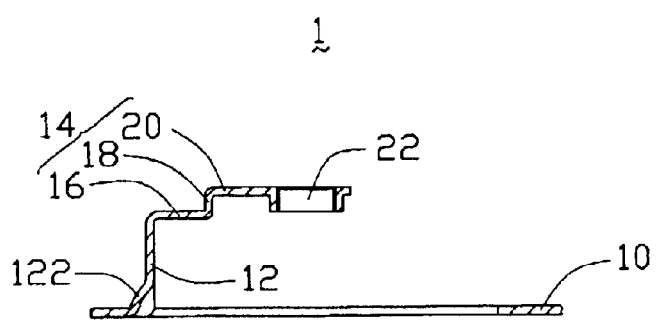
FIG. 3 is a cross-sectional view taken along line III—III of FIG. 2.

Referring to FIGS. 2 and 3, each standoff 1 comprises a support body 12 bent perpendicularly from the bottom plate 10, and a mounting body 14 bent perpendicularly from a distal end of the support body 12. A rib 122 is formed at a bottom portion of the support body 12 adjacent the bottom plate 10. The rib 122 is formed by upwardly and outwardly stamping the support body 12. The rib 122 has a generally triangular pyramidal configuration, with a correspondingly shaped cavity defined at an inside of the support body 12. The rib 122 is for enhancing a mechanical strength of the standoff 1. The mounting body 14 comprises a connection portion 16, a bent portion 18, and a fixing portion 20. The connection portion 16 is bent horizontally from a distal end of the support body 12. The bent portion 18 is bent upwardly from a distal end of the connection portion 16. The fixing portion 20 is bent horizontally from a distal end of the bent portion 18 away from the connection portion 16. The bent portion 18 enhances a mechanical strength of the mounting body 14. A threaded mounting hole 22 is defined in the fixing portion 20, for engagingly receiving a corresponding screw that is extended through a corresponding mounting hole 21.

In the standoff 1 of the present invention, the bent portion 18 and the rib 122 respectively and cooperatively enhance the mechanical strength of the standoff 1. In addition, because the bent portion 18 is oriented perpendicularly to both the connection portion 16 and the fixing portion 20, the mounting body 14 is easily formed by stamping and/or bending.

Figure 4:
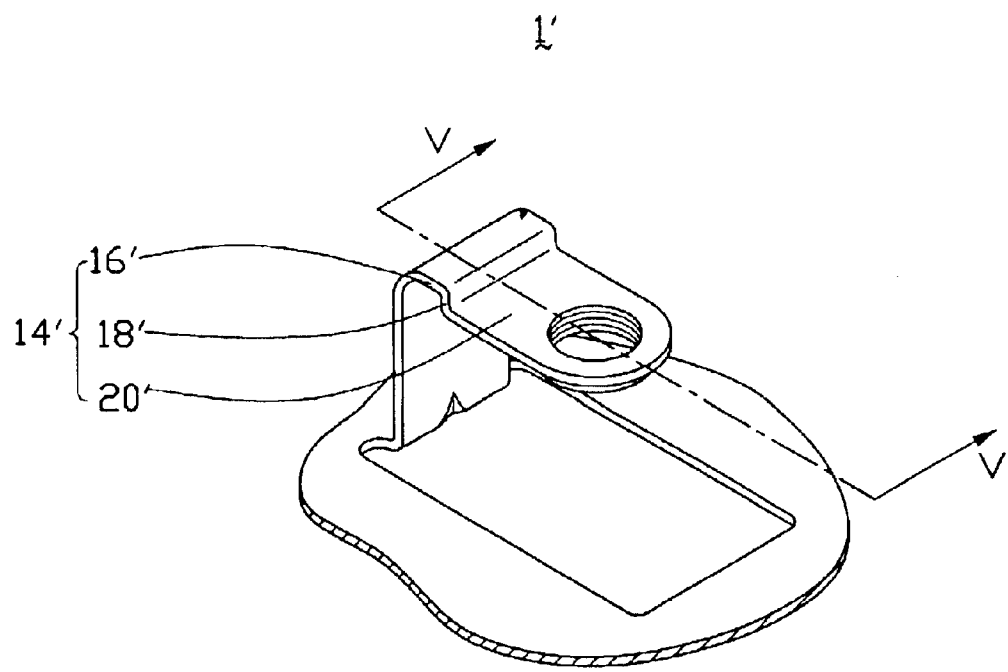
FIG. 4 is an isometric view of a standoff of a circuit board mounting apparatus in accordance with an alternative embodiment of the present invention.
Figure 5:
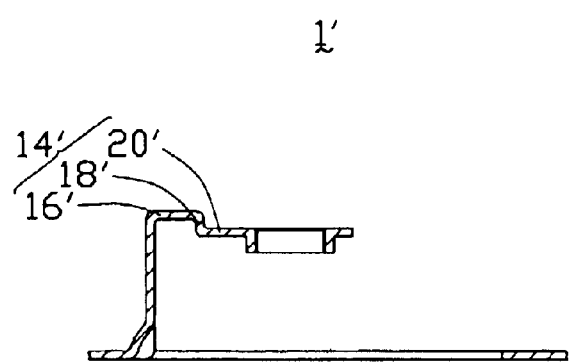
FIG. 5 is a cross-sectional view taken along line V—V of FIG. 4.

FIGS. 4 and 5 show a standoff 1' in accordance with an alternative embodiment of the present invention. The standoff 1' comprises a mounting body 14'. The mounting body 14' comprises a connection portion 16', a bent portion 18', and a fixing portion 20'. The bent portion 18' is bent downwardly from a distal end of the connection portion 16'. The fixing portion 20' is bent horizontally from a distal end of the bent portion 18' away from the connection portion 16'. In other respects, the features and benefits of the standoff 1' are substantially the same as the above-described features and benefits of the standoff 1 of the preferred embodiment.

Figure 6:
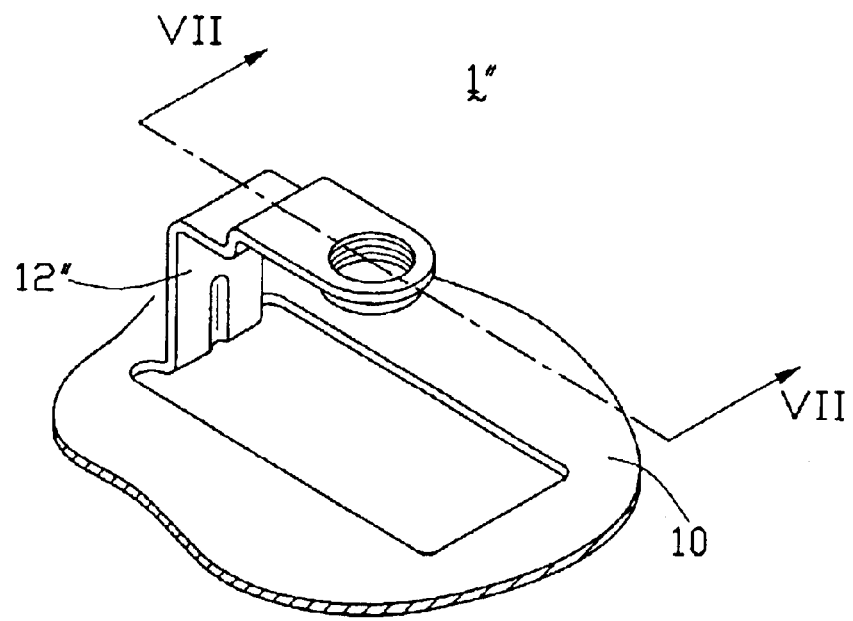
FIG. 6 is an isometric view of a standoff of a circuit board mounting apparatus in accordance with a further alternative embodiment of the present invention.
Figure 7:
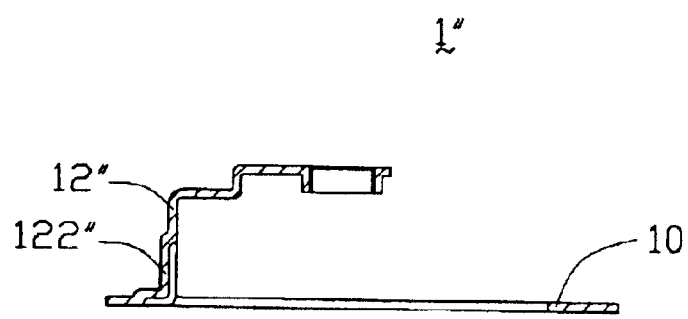
FIG. 7 is a cross-sectional view taken along line VII—VII of FIG. 6.

FIGS. 6 and 7 show a standoff 1" in accordance with a further alternative embodiment of the present invention. The standoff 1" comprises a support body 12" having a rib 122" formed at a bottom portion thereof adjacent the bottom plate 10. The rib 122" has a generally parallelepiped configuration, with a correspondingly shaped cavity defined at an inside of the support body 12". In other respects, the features and benefits of the standoff 1" are substantially the same as the above-described features and benefits of the standoff 1 of the preferred embodiment. In particular, because the rib 122" has a parallelepiped configuration, it is easily formed by stamping.

In practice, the bent portions 18, 18' can be formed by folding and/or bending the corresponding mounting bodies 14, 14' once, twice or more than twice. In still further alternative embodiments of the present invention, the rib of the support body may have a configuration other than triangular pyramidal or parallelepiped. The rib may have any one of other suitable configurations that enhance the mechanical strength of the standoff.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A mounting apparatus adapted to mount a circuit board to a computer enclosure, comprising;
    a carrier plate provided on the computer enclosure;
    a plurality of standoffs each comprising a support body integrally extending from the carrier plate, and a mounting body extending from a distal end of the support body, the support body comprising a rib integrally formed at a jointure of the carrier plate and the support body for enhancing a mechanical strength of the standoff, the mounting body comprising a connection portion, extending from the distal end of the support body, a fixing portion and at least one bent portion for connecting the connection portion and the fixing portion and enhancing a mechanical strength of the standoff.

2. The mounting apparatus as described in claim 1, wherein the at least one bent portion extends from a distal end of the connection portion, the fixing portion extends from the distal end of the at least one bent portion, and the fixing portion defines a mounting hole therein.

3. The mounting apparatus as described in claim 2, wherein the mounting body comprises one bent portion formed by folding the mounting body once.

4. The mounting apparatus as described in claim 2, wherein the at least one bent portion is formed by folding the mounting body more than once.

5. The mounting apparatus as described in claim 1, wherein the rib has a generally triangular pyramidal configuration, with a correspondingly shaped cavity defined at an inside of the support body.

6. The mounting apparatus as described in claim 1, wherein the rib has a generally parallelepiped configuration, with a correspondingly shaped cavity defined at an inside of the support body.

7. A computer assembly comprising:
    a circuit board;
    an enclosure comprising a bottom plate, a plurality of standoffs integrally stamped upwardly from the bottom plate for fixing the circuit board thereon, each of the standoffs comprising a support body integrally extending from the bottom plate and a mounting body cantileverly extending from a distal end of the support body, the mounting body comprising at least one bent portion for enhancing a mechanical strength of the standoff;
    wherein the enclosure comprises a rib integrally formed at a jointure of the bottom plate and the support body for enhancing the mechanical strength of the standoff.

8. The computer assembly as described in claim 7, wherein the mounting body further comprises a connection portion extending from a distal end of the support body, and a fixing portion, the at least one bent portion extends from a distal end of the connection portion, the fixing portion extends from a distal end of the best portion.

9. The computer assembly as described in claim 8, wherein the fixing portion defines a mounting hole therein, and the circuit board defines a plurality of holes corresponding to the mounting holes of the standoffs.

10. The computer assembly as described in claim 8, wherein the mounting body comprises one bent portion formed by folding the mounting body once.

11. The computer assembly as described in claim 8, wherein the at least one bent portion is formed by folding the mounting body more than once.

12. The computer assembly as described in claim 7, wherein the rib has a generally pyramidal configuration, with a correspondingly shaped cavity defined at an inside of the support body.

13. The computer assembly as described in claim 7, wherein the rib has a generally parallelepiped configuration, with a correspondingly shaped cavity defined at an inside of the support body.

* * * * *